(12) United States Patent
Kuhara et al.

(10) Patent No.: US 7,326,905 B2
(45) Date of Patent: Feb. 5, 2008

(54) PHOTODETECTOR AND OPTICAL RECEIVER

(75) Inventors: Yoshiki Kuhara, Suita (JP); Mitsuaki Nishie, Yokohama (JP); Shigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 265 days.

(21) Appl. No.: 11/006,192

(22) Filed: Dec. 7, 2004

(65) Prior Publication Data
US 2005/0133695 A1 Jun. 23, 2005

(30) Foreign Application Priority Data
Dec. 17, 2003 (JP) .............................. 2003/419717

(51) Int. Cl.
*H01J 40/14* (2006.01)
(52) U.S. Cl. ............................ 250/214 R; 250/214 LA
(58) Field of Classification Search ............ 250/214 R, 250/214 LA
See application file for complete search history.

(56) References Cited

U.S. PATENT DOCUMENTS

| 5,196,702 | A | * | 3/1993 | Tsuji et al. | 250/591 |
| 5,504,365 | A | * | 4/1996 | Yamazaki et al. | 257/438 |
| 5,831,322 | A | * | 11/1998 | Dabrowski et al. | 257/438 |
| 6,188,059 | B1 | * | 2/2001 | Nishiyama et al. | 250/214 R |
| 6,437,339 | B2 | * | 8/2002 | Lee et al. | 250/370.09 |
| 6,555,890 | B2 | * | 4/2003 | Dries et al. | 257/458 |
| 2004/0046101 | A1 | * | 3/2004 | Nakamura et al. | 250/200 |

FOREIGN PATENT DOCUMENTS

| JP | 63-077171 | 4/1988 |
| JP | 63-105541 | 5/1988 |

OTHER PUBLICATIONS

U.S. Appl. No. 10/971,644, filed Oct. 21, 2004, "Optical Module And An Optical Receiver Using the Same".

* cited by examiner

*Primary Examiner*—Georgia Epps
*Assistant Examiner*—Kevin Wyatt
(74) *Attorney, Agent, or Firm*—Fish & Richardson P.C.

(57) ABSTRACT

An optical receiver is provided with an optical-signal-receiving section and a controlling section. The optical-signal-receiving section incorporates a photodetector. The photodetector has an APD. Through a passivation film, a photoconductor is placed on a portion of a surface of the APD which remains unoccupied by an optical-signal-receiving area of the APD. When this structure is employed, the signal for controlling the avalanche multiplication factor of the APD can be obtained from the photoconductor. Consequently, the signal can be obtained with a simple structure. Furthermore, the photoconductor has a good linearity of the output current even to a weak lightwave. As a result, the output current I for controlling the avalanche multiplication factor of the APD can be obtained with high accuracy.

10 Claims, 13 Drawing Sheets

PHOTODETECTOR AND OPTICAL RECEIVER

BACKGROUND OF THE INVENTION

1. Field of the Invention

The present invention relates to a photodetector incorporating an avalanche photodiode and to an optical receiver incorporating the photodetector.

2. Description of the Background Art

Optical communication systems have been using an optical receiver incorporating an avalanche photodiode (hereinafter also referred to as APD). An APD has a function of amplifying a signal photocurrent, so that it is suitable as a photodetector to be used in an optical fiber communication system, which deals with a weak optical signal.

However, an APD has a characteristic in that its avalanche multiplication factor varies with temperature variation and the like. This characteristic is caused by the application of a relatively high reverse bias voltage as an applying voltage to the APD at the time of the avalanche multiplication. Consequently, the APD is forced to operate at a voltage in the vicinity of the breakdown voltage of the PN junction. As a result, its operating characteristic becomes highly sensitive to the variation in the ambient temperature and the like. Therefore, it is desirable to control the avalanche multiplication factor of the APD so that a constant multiplication factor can be achieved even when the temperature variation and the like occur.

The published Japanese patent application Tokukaishou 63-77171 has disclosed an optical receiver having a structure for controlling the multiplication factor of an APD. The structure of the optical receiver is shown in FIG. 13. The optical receiver has an optical-signal-receiving area 101 and an optical-signal-monitoring area 102 on a common substrate. These areas receive a signal lightwave from an optical fiber 103. An APD is formed in the optical-signal-receiving area 101. The multiplication factor at the optical-signal-receiving area 101 is controlled according to the monitor signal (output current value) from the optical-signal-monitoring area 102.

The optical receiver disclosed in the foregoing Tokukaishou 63-77171 has a structure in which a photodetection means for monitoring use such as the optical-signal-monitoring area 102 is provided on the same substrate that the APD is formed on. Therefore, the production of the optical receiver having such a structure requires the formation of two types of semiconductor photodetectors having different layer structures on the common substrate, rendering the production process complicated. As a result, an inevitable increase in the production steps and an accompanying reduction in the production yield incur an increase in the production cost.

SUMMARY OF THE INVENTION

The present invention is accomplished in view of the above-described problems. An object of the present invention is to offer a photodetector capable of providing a signal for controlling the avalanche multiplication factor of the APD with a simple structure and an optical receiver incorporating the photodetector.

To solve the above-described problem, the present invention offers a photodetector that is provided with (a) an avalanche photodiode having an optical-signal-receiving area on a surface thereof and (b) a photoconductor placed on the surface of the avalanche photodiode.

In the above-described photodetector, the photoconductor is placed on the surface of the APD. When this structure is employed, the signal for controlling the avalanche multiplication factor of the APD can be obtained from the photoconductor. Consequently, the signal can be obtained with a notably simpler structure than that in which the photoconductor is placed on the same substrate that the APD is formed on.

In addition, the photoconductor is suitable for a relatively slow photodetection such as a task of monitoring a quantity of light for controlling the avalanche multiplication factor of the APD. Furthermore, the photoconductor exhibits a response with a good linearity even for a weak lightwave. Consequently, when the above-described photodetector is used, the signal for controlling the avalanche multiplication factor of the APD can be obtained with high accuracy.

The photodetector may have a structure in which the photoconductor is placed at the outside of the periphery of the optical-signal-receiving area of the avalanche photodiode. When this structure is employed, the signal lightwave having entered the photodetector can be properly distributed to the APD and the photoconductor.

The photodetector may have a structure in which the photoconductor is made of a material capable of transmitting light and is placed on the surface of the avalanche photodiode so as to cover the optical-signal-receiving area of the avalanche photodiode. When this structure is employed, the signal lightwave having entered the photodetector can be properly distributed to the APD and the photoconductor without being affected by the variation in the optical axis and range of incidence of the signal lightwave incident upon the photodetector.

The photodetector may further have an electrical insulator placed between the surface of the avalanche photodiode and the photoconductor. This structure can prevent the crosstalk between the APD and the photoconductor. Consequently, the signal for controlling the avalanche multiplication factor of the APD can be obtained with a further increased accuracy.

The photodetector may have a structure in which the above-described electrical insulator is a passivation film formed on the surface of the avalanche photodiode. In addition, the photodetector may have a structure in which the above-described electrical insulator is an insulating substrate placed on the surface of the avalanche photodiode and has an opening corresponding to the optical-signal-receiving area of the avalanche photodiode. When at least one of the two structures described immediately above is employed, the crosstalk between the APD and the photoconductor can be prevented properly.

In accordance with an aspect of the present invention, the present invention offers an optical receiver for receiving a signal lightwave. The optical receiver is provided with:

(a) any one of the above-described photodetectors; and
(b) a package that:
   (b1) houses the photodetector; and
   (b2) is provided with a lens that condenses the signal lightwave to send it to the avalanche photodiode and the photoconductor of the photodetector.

When this optical receiver is employed, the signal for controlling the avalanche multiplication factor of the APD can be obtained from the photoconductor with high accuracy. Consequently, the avalanche multiplication factor of the APD can be controlled with high accuracy in accordance with the output signal from the photoconductor. Furthermore, when the lens for condensing the signal lightwave is provided, the signal lightwave can be properly introduced into the APD and the photoconductor.

The optical receiver for receiving a signal lightwave may be provided with:

(a) any one of the above-described photodetectors; and
(b) a controlling means for controlling at least one of the supply voltage to the avalanche photodiode and the current flowing through the avalanche photodiode in accordance with the value of the output current of the photoconductor so that the avalanche photodiode can maintain an intended avalanche multiplication factor.

When this optical receiver is employed, the avalanche multiplication factor of the APD can be satisfactorily controlled in accordance with the value of the output current from the photoconductor.

The optical receiver may have a controlling means that controls at least one of the supply voltage to the avalanche photodiode and the current flowing through the avalanche photodiode such that the average value of the output current of the avalanche photodiode receiving the signal lightwave approaches the value expressed by the following formula:

$$m \cdot Idtr_1 \cdot (Iava_2/Idtr_2)$$

where "m" is an intended avalanche multiplication factor;
$Idtr_1$ is the value of the output current from the photoconductor; and
$Iava_2$ and $Idtr_2$ are respectively the value of the output current of the avalanche photodiode in the PIN mode and the value of the output current of the photoconductor when the optical receiver receives a lightwave having a certain quantity of light.

This system can achieve an intended avalanche multiplication factor with high accuracy.

The optical receiver may have a controlling means that is provided with:

(a) a converting circuit for converting the value of an output current from the photoconductor into a voltage signal;
(b) a current mirror circuit that has (b1) an input terminal, (b2) a first output terminal connected to the avalanche photodiode, and (b3) a second output terminal and that is structured such that the value of the current at the second output terminal is nearly equal to the value of the current at the first output terminal;
(c) a power supply circuit for supplying the supply voltage to the input terminal of the current mirror circuit; and
(d) a voltage control circuit for controlling the supply voltage in accordance with both the voltage signal from the converting circuit and the value of the current at the second output terminal of the current mirror circuit.

In this optical receiver, in the current mirror circuit, the value of the current at the second output terminal is nearly equal to the value of the current fed to the APD from the first output terminal. This feature is exploited to control the supply voltage to the APD in accordance with the value of the current at the second output terminal. This system can further improve the control of the avalanche multiplication factor of the APD.

The optical receiver may have a controlling means that is provided with:

(a) a converting circuit for converting the value of an output current from the photoconductor into a voltage signal;
(b) a current mirror circuit that is provided with (b1) an input terminal, (b2) a first output terminal, and (b3) a second output terminal connected to the avalanche photodiode and that is structured such that the value of the current at the second output terminal is nearly equal to the value of the current at the first output terminal;
(c) a power supply circuit for supplying the supply voltage to the input terminal of the current mirror circuit; and
(d) a current control circuit for controlling the value of the current at the first output terminal of the current mirror circuit in accordance with the voltage signal from the converting circuit.

In this optical receiver, in the current mirror circuit, the value of the current at the second output terminal is nearly equal to the value of the current fed to the APD from the first output terminal. This feature is exploited to control the value of the current to be fed to the APD from the second output terminal by controlling the value of the current at the first output terminal. This system can further improve the control of the avalanche multiplication factor of the APD.

When the photodetector of the present invention is used, the signal for controlling the avalanche multiplication factor of the APD can be obtained with high accuracy by using a simple structure. In addition, when the optical receiver of the present invention is used, the avalanche multiplication factor of the APD can be controlled with high accuracy by using the output signal from the photoconductor.

DETAILED DESCRIPTION OF THE INVENTION

Figure 1:
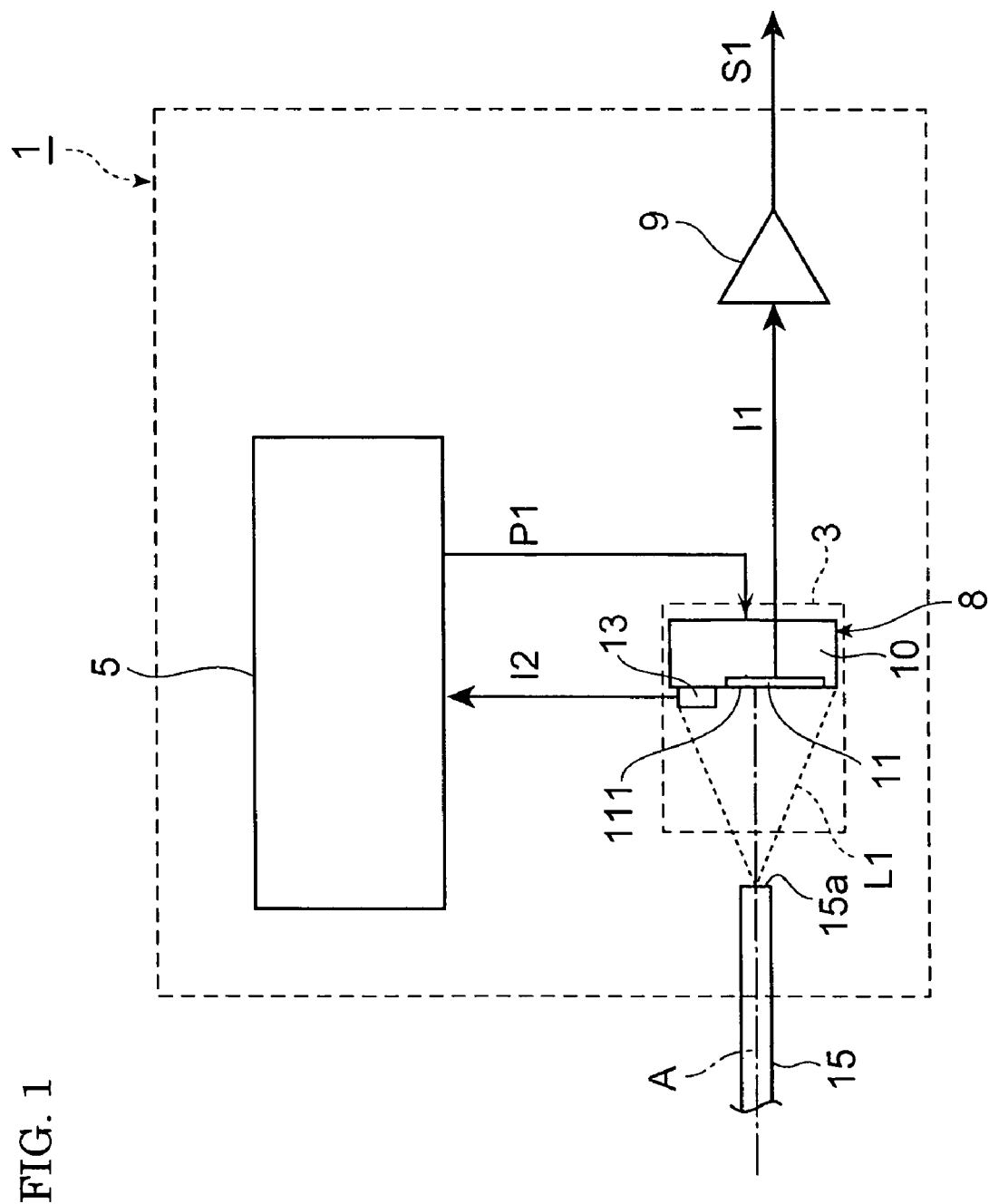
FIG. 1 is a block diagram showing an embodiment of the optical receiver of the present invention.

Embodiments of the photodetector and optical receiver of the present invention are explained below in detail by referring to the accompanying drawing. In the drawing, the same reference signs are given to the same elements to avoid duplicated explanations. The ratio of the dimensions in the drawing does not necessarily coincide with the actual ratio.

EMBODIMENT

FIG. 1 is a block diagram showing an embodiment of the photodetector and optical receiver of the present invention. As shown in FIG. 1, an optical receiver 1 of this embodiment is provided with an optical-signal-receiving section 3, a controlling section 5, an amplifier 9, and an optical fiber 15. The optical fiber 15 transmits from an end 15a a signal lightwave L1 having traveled from the outside of the optical receiver 1 to the optical-signal-receiving section 3.

The optical-signal-receiving section 3 is provided with a photodetector 8. The photodetector 8 has (a) an APD 10 having an optical-signal-receiving area 11 at a surface 111 and (b) a photoconductor 13. The photoconductor 13 is placed on a portion of the surface 111 of the APD 10 which remains unoccupied by the optical-signal-receiving area 11. The photodetector 8 is placed such that the surface 111 of the APD 10 intersects the optical axis A of the optical fiber 15. The optical-signal-receiving area 11 of the APD 10 and the photoconductor 13 are each coupled optically with the end 15a of the optical fiber 15. The APD 10 receives a part of the signal lightwave L1 emerging from the end 15a of the optical fiber 15 along the optical axis A. For example, the APD 10 receives 90% to 99% of the quantity of light of the signal lightwave L1. The photoconductor 13 receives another part of the signal lightwave L1 emerging from the end 15a of the optical fiber 15 along the optical axis A. For example, the photoconductor 13 receives 1% to 10% of the quantity of light of the signal lightwave L1.

The APD 10 is a device for converting the received signal lightwave L1 into an output current I1. The cathode of the APD 10 is electrically connected to the controlling section 5, and the anode of the APD 10 is electrically connected to the amplifier 9. The APD 10 operates by receiving a supply voltage P1 from the controlling section 5 to the cathode. When the optical-signal-receiving area 11 receives the signal lightwave L1, the APD 10 produces an output current I1 according to the received quantity of light. At this moment, at the inside of the APD 10, the avalanche multiplication function produces the output current I1 by multiplying the photocurrent generated by the incident signal lightwave L1 by a predetermined multiplication factor. The APD 10 sends the produced output current I1 to the amplifier 9 from the anode. The amplifier 9 converts the output current I1 from the APD 10 into a voltage signal and amplifies it to produce a received signal S1. The received signal S1 is sent out of the optical receiver 1.

The photoconductor 13 is made of a material that varies the value of its resistance in accordance with the received quantity of light. The types of the material for the photoconductor 13 include CdS, PbS, PbSe, Si, Ge, and InGaAs. The photoconductor 13 converts the received signal lightwave L1 into an output current I2. The photoconductor 13 is provided with two electrodes attached with ohmic contact, across which a predetermined voltage is applied. At least one of the two electrodes is electrically connected to the controlling section 5. When the photoconductor 13 receives the signal lightwave L1, the value of its resistance varies, varying the value of the current flowing through the two electrodes, which is an output current I2. The output current I2 is fed into the controlling section 5 as the output signal from the photoconductor 13.

The controlling section 5 is a controlling means in this embodiment. It controls the supply voltage P1 to the APD 10 in accordance with the value of the output current from the photoconductor 13 so that the APD 10 can maintain the predetermined avalanche multiplication factor. More specifically, the controlling section 5 detects the quantity of light of the signal lightwave L1 received by the photoconductor 13 by using the output current I2 from the photoconductor 13. The controlling section 5 produces the supply voltage P1 to the APD 10 in accordance with the quantity of light of the signal lightwave L1 received by the photoconductor 13 so that the photocurrent generated according to the quantity of light of the signal lightwave L1 received by the optical-signal-receiving area 11 of the APD 10 can be avalanche-multiplied at a predetermined multiplication factor. The controlling section 5 can be formed by using (a) an arithmetic and logic unit incorporating a CPU and another member and (b) an electric circuit and another member, for example.

Figure 2:
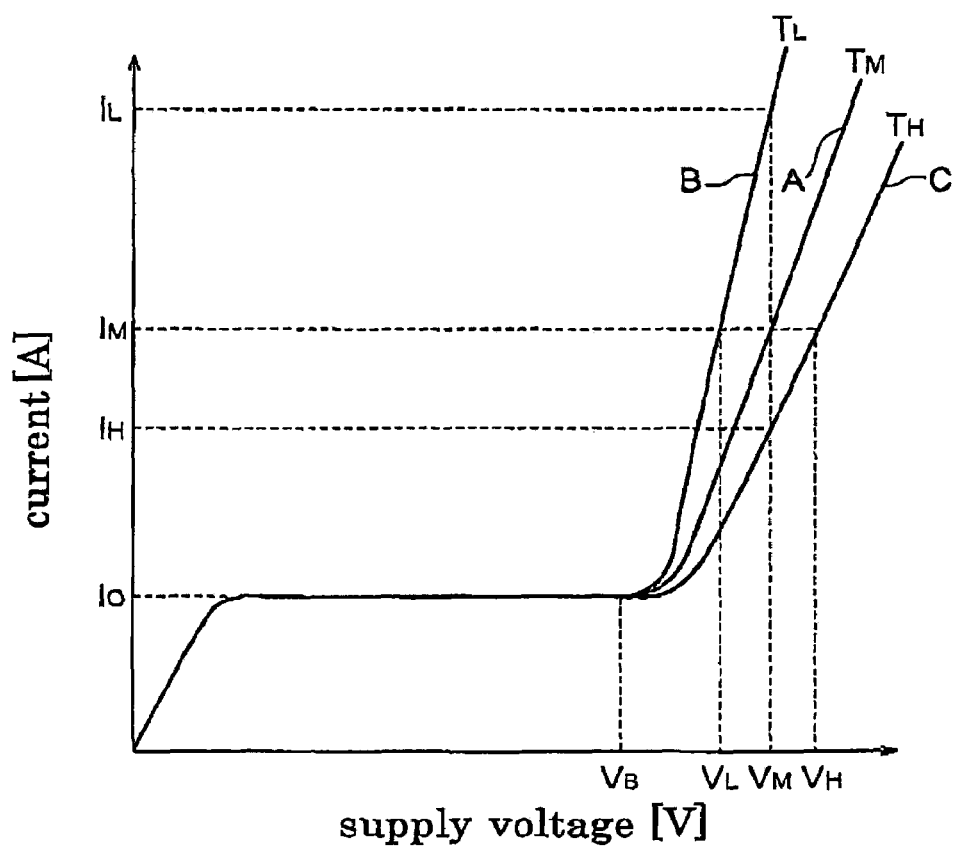
FIG. 2 is a graph showing the characteristic of the output current of an APD against the supply voltage.

The above-described function of the controlling section 5 is explained below in further detail. FIG. 2 is a graph showing the characteristic of the output current of the APD 10 against the supply voltage. In the graph shown in FIG. 2, the quantity of light entering the optical-signal-receiving area 11 of the APD 10 is maintained constant. As shown in FIG. 2, when a supply voltage lower than a particular voltage $V_B$ is applied to the APD 10, the APD 10 generates a photocurrent $I_0$ corresponding to the quantity of the incident light. This state is referred to as a PIN mode in the APD 10. When a supply voltage higher than the voltage $V_B$ is applied to the APD 10, the APD performs the avalanche multiplication action. In this case, the value of the output current from the APD 10 becomes a value obtained by multiplying the photocurrent $I_0$ by a predetermined multiplication factor.

The avalanche multiplication is produced by applying a relatively high reverse bias voltage to the APD 10 as a supply voltage. At this moment, the APD 10 is forced to operate at a voltage in the vicinity of the breakdown voltage of the PN junction. As a result, its operating characteristic becomes highly sensitive to the variation in the temperature of the APD 10 and the like. For example, in FIG. 2, Curves A, B, and C represent the characteristics when the temperatures of the APD 10 are $T_M$, $T_L$, and $T_H$, respectively ($T_L < T_M < T_H$). Consequently, even when the quantity of light is constant and the magnitude of the supply voltage to the APD 10 is the same ($V_M$, for example), the value of the output current from the APD 10 varies from $I_H$ to $I_M$ to $I_L$, for example, in accordance with the temperature variation.

In the graph shown in FIG. 2, when the output current $I_M$, for example, is targeted at a predetermined quantity of incident light ($I_M = m \cdot I_0$, where "m" is an intended avalanche multiplication factor), the supply voltage can be varied from $V_L$ to $V_H$ to $V_M$, for example, in accordance with the variation in the characteristic of the APD 10.

Up to now, a method has been mainly used in which the supply voltage is varied according to the temperature of the APD measured by using a thermistor or the like. However, because of the individual difference in the temperature characteristic of the APD, it is difficult to achieve an intended avalanche multiplication factor "m" with high accuracy by this method.

On the other hand, the controlling section 5 of this embodiment controls the avalanche multiplication factor of the APD 10 in accordance with the output current I2 from the photoconductor 13. First, the optical receiver 1 receives a lightwave having a certain light quantity emerged from the optical fiber 15. In this case, the value of the output current I1 of the APD 10 in the PIN mode is expressed as Iava$_2$ (A), and the value of the output current I2 of the photoconductor 13, as Idtr$_2$ (A). The supply voltage P1 is controlled such that the average value of the output current I1 of the APD 10 receiving the signal lightwave L1 approaches the value expressed by the following formula:

$$m \cdot Idtr_1 \cdot (Iava_2 / Idtr_2)$$

where "m" is an intended avalanche multiplication factor; and

Idtr$_1$ is the value of the output current I2 (A) from the photoconductor 13 for the signal lightwave L1.

This process enables the achievement of the intended avalanche multiplication factor "m" of the APD 10 without being affected by the temperature variation and the like. In the above description, the term "the average value of the output current I1" means that in the output current I1 corresponding to the encoded signal lightwave L1, the average value during a time sufficient to include a plurality of codes. The average value of the output current I1 can be calculated by using an integral circuit, for example.

Figure 3:
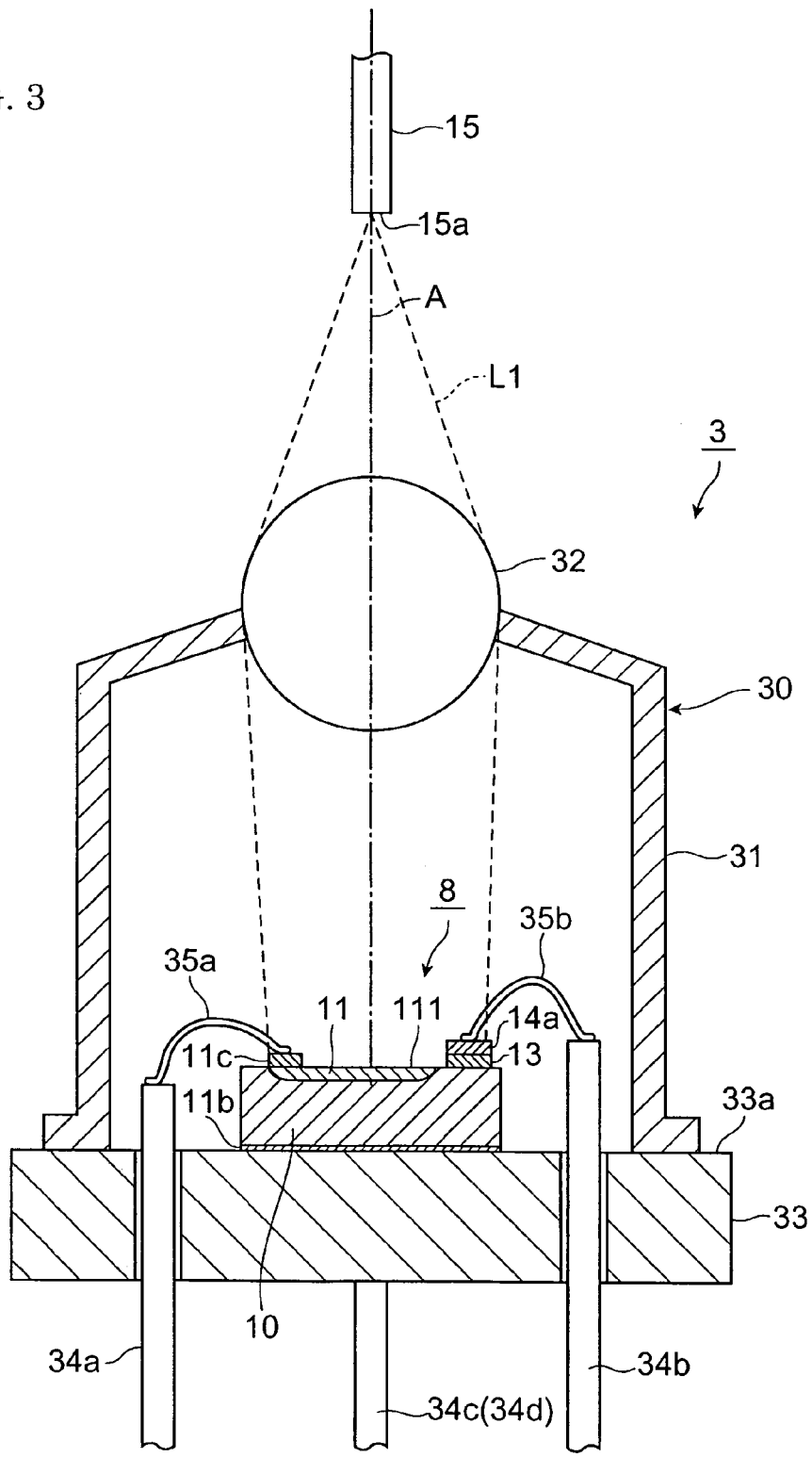
FIG. 3 is a cross-sectional view showing the optical-signal-receiving section of this embodiment.

Next, the optical-signal-receiving section 3 is explained below in detail. FIG. 3 is a cross-sectional view showing the optical-signal-receiving section 3 of this embodiment. As shown in FIG. 3, the optical-signal-receiving section 3 is provided with a photodetector 8 and a package 30.

The package 30 houses the photodetector 8. The package 30 has a structure known as the coaxial-type CAN package. It is provided with a cap 31, a lens 32, a stem 33, and lead pins 34a to 34d.

The stem 33 is a disk-shaped member having electrical conductivity. A plurality of lead pins 34a to 34d are attached to the stem 33 such that they penetrate through it thicknesswise. The lead pins 34a, 34b, and 34d are electrically insulated from the stem 33. The photodetector 8 is mounted on a main surface 33a of the stem 33. The stem 33 is electrically connected through solder or another means to the cathode 11b formed at the rear face of the APD 10 of the photodetector 8. In addition, the stem 33 is electrically connected to the lead pin 34c through a bonding wire (not shown).

The anode 11c of the APD 10 is electrically connected to the lead pin 34a through a bonding wire 35a. The APD 10 introduces the supply voltage P1 into it through the lead pin 34c and sends the output current I1 to the outside of the optical receiver 3. In this embodiment, the lead pin 34c is electrically connected to the controlling section 5 (see FIG. 1) and the lead pin 34a is electrically connected to the amplifier 9 (see FIG. 1).

An electrode 14a of the two electrodes of the photoconductor 13 of the photodetector 8 is electrically connected to the lead pin 34b through a bonding wire 35b. The other electrode (not shown) of the photoconductor 13 is electrically connected to the lead pin 34d through another bonding wire (not shown). A predetermined voltage is applied across the electrodes of the photoconductor 13 through the lead pins 34b and 34d. The photoconductor 13 sends the output current I2 flowing through the electrodes to the outside of the optical-signal-receiving section 3 through at least one of the lead pins 34b and 34d. In this embodiment, the lead pin 34d is electrically connected to the controlling section 5 (see FIG. 1) and the lead pin 34b is electrically connected to a specific terminal of a specific power source.

The cap 31 is a member for covering the photodetector 8. The cap 31 has a cylindrical shape whose one end is closed. It is made of a metal materiel such as stainless steel, steel, iron-nickel alloy, or brass. The cap 31 is fixed to the stem 33 such that its other end makes contact with the main surface 33a of the stem 33. The cap 31 is provided at the closed end with a spherical lens 32 optically coupled with the optical-signal-receiving area 11 of the APD 10 and the photoconductor 13. The lens 32 is positioned between the end 15a of the optical fiber 15 and the photodetector 8. The signal lightwave L1 having emerged from the end 15a of the optical fiber 15 is condensed by the lens 32 to enter the optical-signal-receiving area 11 of the APD 10 and the photoconductor 13.

Figure 4:
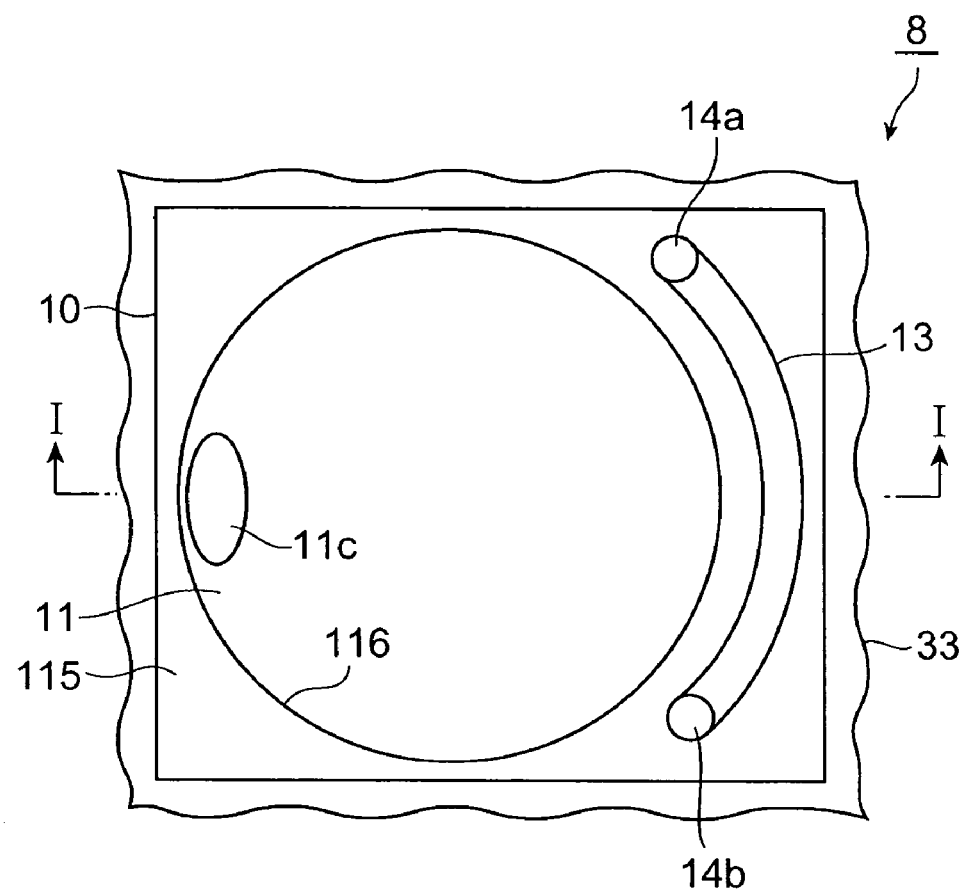
FIG. 4 is a plan view showing a photodetector mounted on a stem.
Figure 5:
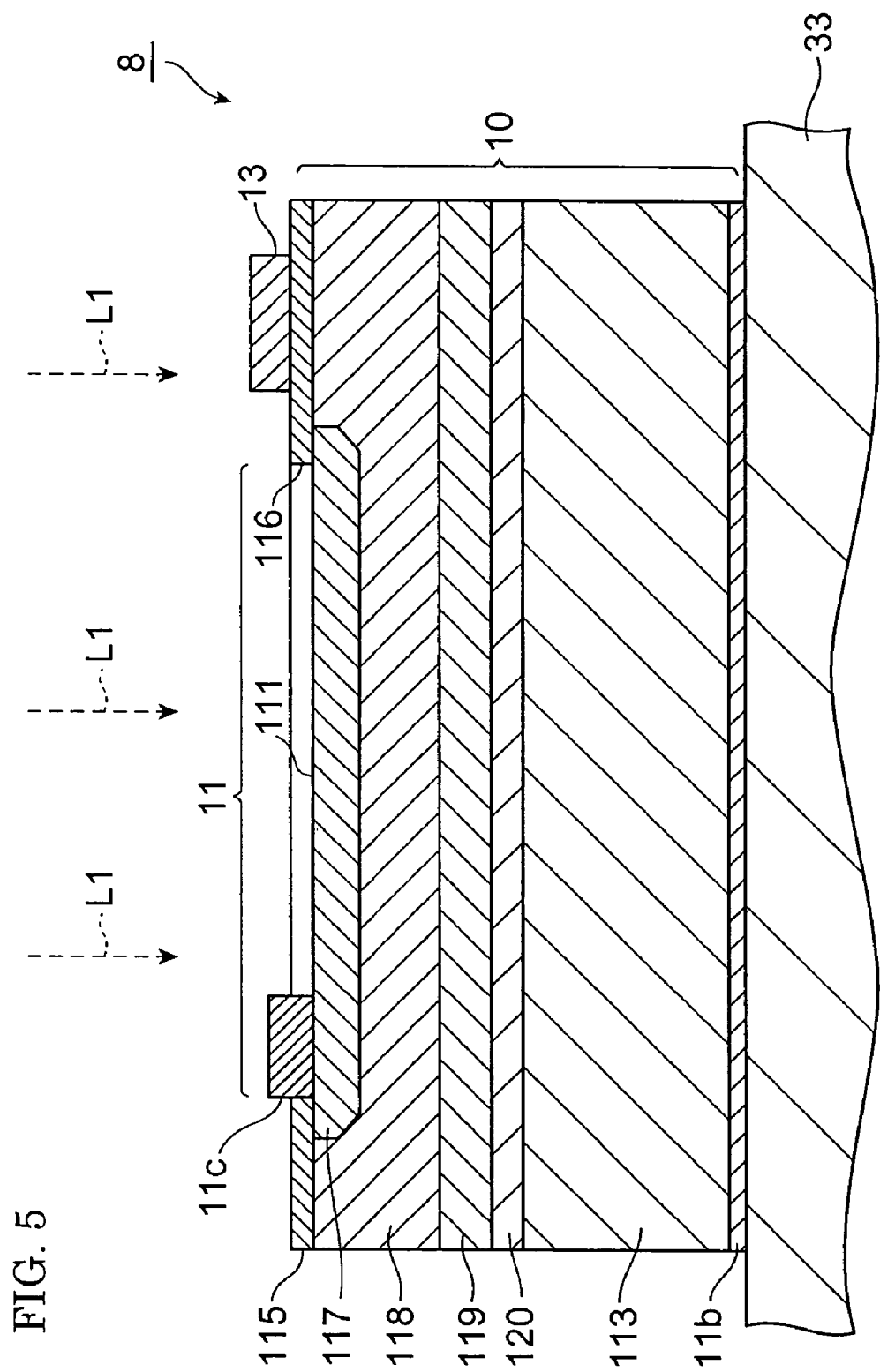
FIG. 5 is a view showing the I-I cross section of the photodetector shown in FIG. 4.

FIG. 4 is a plan view showing the photodetector 8 mounted on the stem 33. FIG. 5 is a view showing the I-I cross section of the photodetector 8 shown in FIG. 4. As shown in FIG. 5, the photodetector 8 has a semiconductor substrate 113, an n-type buffer layer 120, an n-type absorption layer 119, a multiplication layer 118, a p-type semiconductor layer 117, an anode 11c, and a cathode 11b, all of which constitute the APD 10. Of these members, the n-type buffer layer 120, the n-type absorption layer 119, and the multiplication layer 118 are epitaxially grown on the semiconductor substrate 113 in this order.

The semiconductor substrate 113 is made of high-concentration n-type InP doped with S, for example. The n-type buffer layer 120 is made of n-type InP, for example. It has a thickness of at most 1 μm, for example. The n-type absorption layer 119 is made of n-type InGaAs, for example. It has a thickness of at most 2 μm, for example. The multiplication layer 118 is made of n-type InP, for example. It has a thickness of at most 2 μm, for example. The p-type semiconductor layer 117 is formed in a predetermined region in the vicinity of the surface in the multiplication layer 118 by implanting Cd ions, for example. The anode 11c is provided at a portion on the p-type semiconductor layer 117. It has an Au—Zn laminated structure, for example. The cathode 11b is provided on the semiconductor substrate 113's face opposite to its face in contact with the n-type buffer layer 120. It has an Au—Ge—Ni laminated structure, for example.

A passivation film 115 having an opening 116 is formed on the surface 111 of the APD 10, that is, on the multiplication layer 118. The passivation film 115 is an electrical insulator in this embodiment. It is made of an oxide such as SiON. The p-type semiconductor layer 117 exposed by the opening 116 forms the optical-signal-receiving area 11 of the APD 10. A photoconductor 13 is provided on a portion of the passivation film 115.

When the APD 10 is operated, a relatively high voltage is applied across the anode 11c and the cathode 11b. In the APD 10, when a signal lightwave L1 having a wavelength of 1.0 to 1.6 μm enters the optical-signal-receiving area 11, for example, the signal lightwave L1 is absorbed in the n-type absorption layer 119. Then, carriers corresponding to the quantity of light of the incident signal lightwave L1 are generated at the n-type absorption layer 119. The carriers are avalanche-multiplied in the multiplication layer 118 under an intensive electric field. The avalanche-multiplied carriers are extracted from the anode 11c as the output current I1 (see FIG. 1).

As shown in FIG. 4, the optical-signal-receiving area 11 of the APD 10 has a circular shape when viewed from above.

The photoconductor 13 extends along a portion of the periphery of the circular optical-signal-receiving area 11. The photoconductor 13 has an electrode 14a at its one end and an electrode 14b at its other end.

Figure 6:
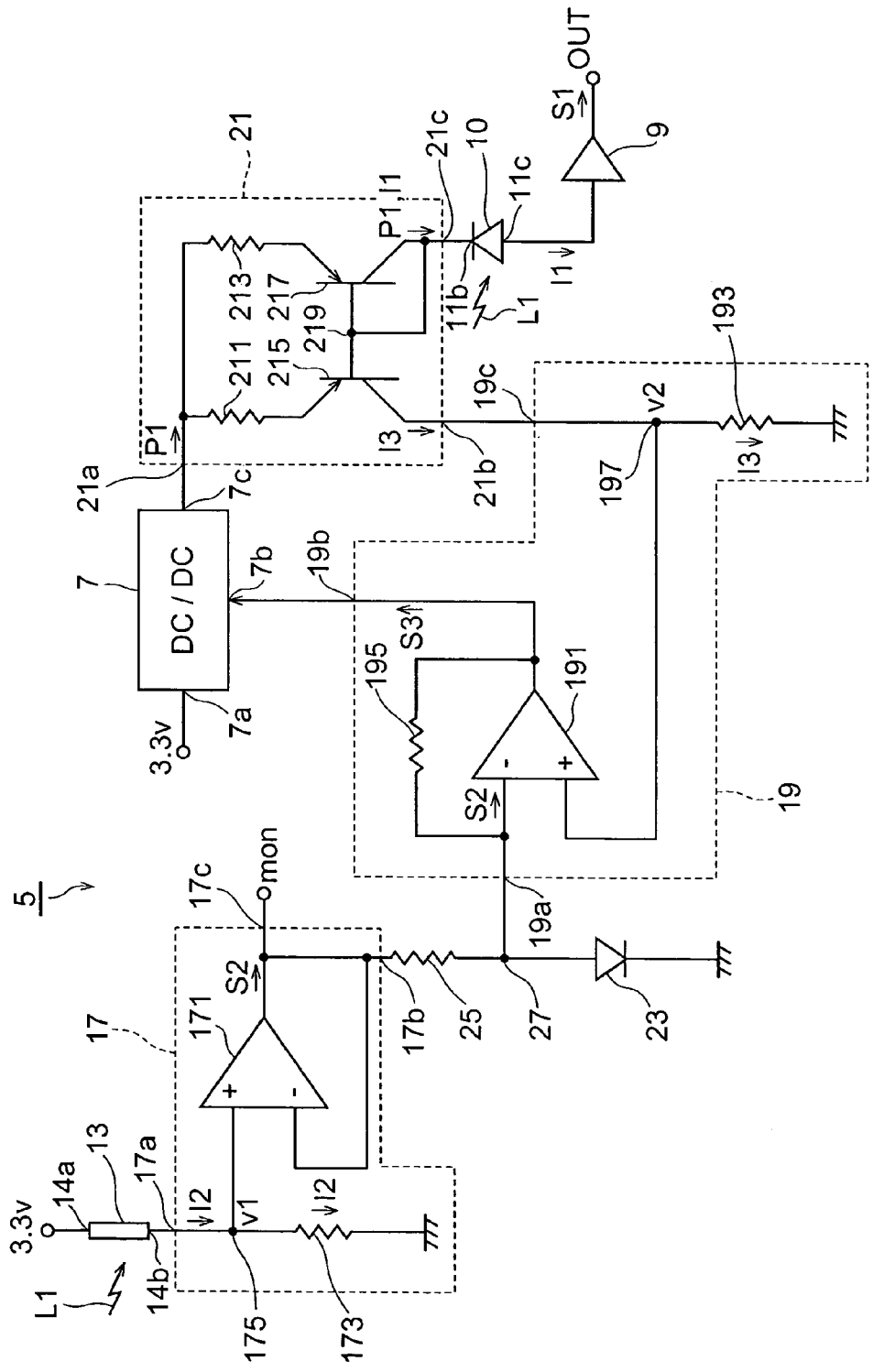
FIG. 6 is a circuit diagram showing the internal circuit of a controlling section.

Next, the controlling section 5 is explained below in detail. FIG. 6 is a circuit diagram showing the internal circuit of the controlling section 5.

As shown in FIG. 6, the controlling section 5 has a DC-DC converter 7, a converting circuit 17, a current mirror circuit 21, and a voltage control circuit 19. The DC-DC converter 7 is a power supply circuit in this embodiment. It has input terminals 7a and 7b and an output terminal 7c. The input terminal 7a is electrically connected to a terminal of a power source having a specific output voltage (3.3 V, for example). The output terminal 7c is electrically connected to the current mirror circuit 21. The input terminal 7b is electrically connected to the voltage control circuit 19. The DC-DC converter 7 receives a control signal S3 (described below) from the voltage control circuit 19. The DC-DC converter 7 transforms the supply voltage from the terminal of the power source in accordance with the control signal S3 to produce a supply voltage P1. The DC-DC converter 7 supplies the supply voltage P1 to the current mirror circuit 21 from the output terminal 7c.

The current mirror circuit 21 includes resistance elements 211 and 213 and PNP transistors 215 and 217. It also has an input terminal 21a, an output terminal 21b (second output terminal), and an output terminal 21c (first output terminal). The current mirror circuit 21 is structured such that the value of the current at the output terminal 21b is nearly equal to that at the output terminal 21c. More specifically, the emitter of the transistor 215 is electrically connected to the input terminal 21a through the resistance element 211. The emitter of the transistor 217 is electrically connected to the input terminal 21a through the resistance element 213. The input terminal 21a of the current mirror circuit 21 is electrically connected to the output terminal 7c of the DC-DC converter 7, so that the DC-DC converter 7 supplies the supply voltage P1. The base of the transistor 215 is electrically connected to the base of the transistor 217 via a node 219. The node 219 is electrically connected to the collector of the transistor 217. The collector of the transistor 215 is electrically connected to the output terminal 21b of the current mirror circuit 21. The collector of the transistor 217 is electrically connected to the cathode 11b of the APD 10 via the output terminal 21c of the current mirror circuit 21. As described before, the anode 11c of the APD 10 is electrically connected to the amplifier 9.

The converting circuit 17 includes a buffer amplifier 171 and a resistance element 173. It also has an input terminal 17a and output terminals 17b and 17c. One end of the resistance element 173 is electrically connected to the electrode 14b of the photoconductor 13 via a node 175 and the input terminal 17a. The electrode 14a of the photoconductor 13 is electrically connected to a specific terminal of a power source (the output voltage is 3.3 V, for example). The other end of the resistance element 173 is electrically connected to a ground potential line. The plus-side input terminal of the buffer amplifier 171 is electrically connected to the node 175. The minus-side input terminal of the buffer amplifier 171 is electrically connected to the output terminal of the buffer amplifier 171. The output terminal of the buffer amplifier 171 is electrically connected to a monitoring terminal via the output terminal 17c and to one end of a resistance element 25 via the output terminal 17b. The other end of the resistance element 25 is electrically connected to the ground potential line through a node 27 and a diode 23.

The voltage control circuit 19 includes an OP amplifier 191 and resistance elements 193 and 195. It also has input terminals 19a and 19c and an output terminal 19b. The minus-side input terminal of the OP amplifier 191 is electrically connected to the node 27 via the input terminal 19a and to the output terminal of the OP amplifier 191 through the resistance element 195. The output terminal of the OP amplifier 191 is electrically connected to the input terminal 7b of the DC-DC converter 7 via the output terminal 19b of the voltage control circuit 19. The plus-side input terminal of the OP amplifier 191 is electrically connected to a node 197. The node 197 is electrically connected to the ground potential line through the resistance element 193 and to the output terminal 21b of the current mirror circuit 21 via the input terminal 19c of the voltage control circuit 19.

Next, the operation of the optical receiver 1 and the photodetector 8 of this embodiment is explained below. As shown in FIGS. 1 and 3, when the optical-signal-receiving section 3 receives the signal lightwave L1 having traveled the optical fiber 15, a part of the signal lightwave L1 enters the optical-signal-receiving area 11 of the APD 10 and another part of the signal lightwave L1 enters the photoconductor 13.

As shown in FIG. 6, a voltage of 3.3 V is applied across the electrodes 14a and 14b of the photoconductor 13, so that when the signal lightwave L1 enters the photoconductor 13, the value of the resistance of the photoconductor 13 varies, causing the output current I2 to flow in accordance with the quantity of the incident light. The output current I2 is fed to the converting circuit 17 and flows through the node 175 and the resistance element 173 to reach the ground potential line. At this moment, the resistance element 173 produces a voltage V1 at the node 175. When the voltage V1 is applied to the buffer amplifier 171, a voltage signal S2 is produced in accordance with the quantity of the light incident upon the photoconductor 13.

The voltage signal S2 produced in the converting circuit 17 exits from the output terminal 17b of the converting circuit 17, flows through the resistance element 25 and the node 27, and finally enters the voltage control circuit 19. In this operation, the following protection is provided. If a signal lightwave having an excessive quantity of light enters the photoconductor 13 and the magnitude of the produced voltage signal S2 exceeds a specified value, the diode 23 operates to prevent an excess current from flowing through the OP amplifier 191.

On the other hand, through the current mirror circuit 21, the DC-DC converter 7 applies a supply voltage P1 in the form of a reverse bias voltage across the cathode 11b and the anode 11c of the APD 10. Under this condition, when the signal lightwave L1 enters the APD 10, the APD 10 produces the output current I1 corresponding to the quantity of the incident light. The output current I1 is converted into a voltage signal by the amplifier 9 to form a receive signal S1. The received signal S1 is sent out of the optical receiver 1. At this moment, the current mirror circuit 21 nearly equalizes the value of a current I3 flowing through the resistance element 211 and the transistor 215 with the value of a current I1 flowing through the resistance element 213 and the transistor 217. The current I3 exits from the output terminal 21b of the current mirror circuit 21, flows through the input terminal 19c, the node 197, and the resistance element 193 of the voltage control circuit 19 in this order, and enters the ground potential line. When the current I3 flows through the resistance element 193 of the voltage control circuit 19, a voltage V2 is produced at the node 197. The voltage V2 is applied to the plus-side input terminal of the OP amplifier 191.

The voltage signal S2 produced in the converting circuit 17 and sent to the voltage control circuit 19 enters the minus-side terminal of the OP amplifier 191. Because the output of the OP amplifier 191 is negatively fed back through the resistance element 195, the difference in magnitude between the voltage signal S2 and the voltage V2 is amplified at a predetermined amplification factor to produce the control signal S3. Therefore, the magnitude of the control signal S3 increases when the ratio between the value of the output current I1 of the APD 10 and that of the output current I2 of the photoconductor 13 deviates from a predetermined value. When the DC-DC converter 7 receives the control signal S3 from the voltage control circuit 19, it controls the magnitude of the supply voltage P1 such that the magnitude of the control signal S3 approaches zero.

The supply voltage P1 to the APD 10 is controlled by the above-explained operation, so that the APD 10 can maintain an intended avalanche multiplication factor "m." In this embodiment, it is desirable to determine the value of the resistance element 193 by the following procedure. First, when a lightwave having a certain quantity of light enters the optical receiver 1, measurements are conducted to obtain the value of the output current I1 (Iava$_2$) of the APD 10 in the PIN mode and the value of the output current I2 (Idtr$_2$) of the photoconductor 13. Second, the ratio between the two values and an intended avalanche multiplication factor "m" are used to calculate the product "m·(Iava$_2$/Idtr$_2$)." This product is used to determine the value of the resistance element 193. The avalanche multiplication factor "m" can be changed by changing the value of the resistance element 193. When the resistance element 193 is provided as a digital potentiometer, the avalanche multiplication factor "m" can be changed by using an external signal. Examples of numerical values for the circuit diagram shown in FIG. 6 are summarized below:

Output current I1: 10 µA (quantity of light incident on APD 10: 0.95 µW)
Output current I2: 50 nA (quantity of light incident on photoconductor 13: 0.05 µW)
Current I3: 10 µA
Resistance element 173: 100 kΩ
Resistance element 193: 500 kΩ
Resistance element 195: a value large enough to prevent an oscillation in the closed loop in relation to the OP amplifier 191
Resistance element 211: 1 kΩ
Resistance element 213: 1 kΩ
Supply voltage P1: 50 V
Voltage V1: 5 mV
Voltage V2: 5 mV.

Alternatively, the following numerical values may be employed for the resistance elements 211, 213, and 193 and the current I3. In this case, the power consumption in the DC-DC converter 7 can be reduced to 11/20 that in the case when the above-described numerical values are used.

Current I3: 1 µA
Resistance element 211: 10 kΩ
Resistance element 213: 1 kΩ
Resistance element 193: 5 MΩ.

The photodetector 8 in this embodiment has the following effects. As described above, in the photodetector 8 in this embodiment, the photoconductor 13 is placed on the surface 111 of the APD 10. Consequently, a signal for controlling the avalanche multiplication factor of the APD 10 can be obtained from the photoconductor 13. In other words, the signal can be obtained with a simple structure that only forms the photoconductor 13 and the electrodes 14a and 14b on the APD 10. The photoconductor 13 is suitable for a relatively slow photodetection such as a task of monitoring a quantity of light for controlling the avalanche multiplication factor of the APD 10 as in this embodiment. The photoconductor 13 exhibits a response with a good linearity even for a lightwave having a relatively small quantity of light. In this embodiment, of the signal lightwave L1, the percentage of light entering the photoconductor 13 is as small as 1% to 10%. Nevertheless, a good linearity is achieved between the output current I2 and the quantity of incident light of the signal lightwave L1. As a result, when the photodetector 8 in this embodiment is used, the signal for controlling the avalanche multiplication factor of the APD can be obtained with high accuracy.

Figure 13:
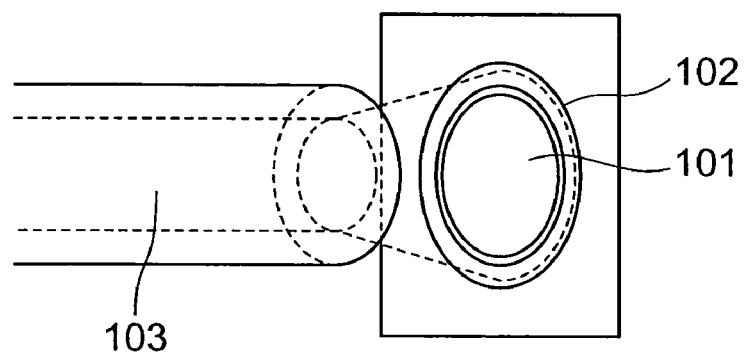
FIG. 13 is a diagram showing the structure of a conventional optical receiver.

When a photodiode is used as a light-quantity monitor for an APD as in the optical receiver shown in FIG. 13, a complicated structure is inevitable in connecting the anodes and cathodes of the APD and photodiode to the four lead pins of the package. In addition, a structure may be conceived in which one electrode (usually, cathode) of the photodiode is connected to the cathode of the APD (or a common electrode is formed in place of two independent electrodes) to reduce the number of lead pins to three (formation of a three-terminal structure). In this case, however, a voltage across the terminals is increased, increasing the number of circuits operating at a high voltage. Furthermore, when one electrode of the photodiode is connected to the anode of the APD, the effective capacity of the APD is increased. This increase may deteriorate the sensitivity of the APD. With respect to these problems, in the photodetector 8 of this embodiment, the individual electrodes of the APD 10 and photoconductor 13 can be connected to four lead pins 34a to 34d with a simple structure. In addition, even when one electrode of the photoconductor 13 is connected to the anode 11c of the APD 10, when the photoconductor 13 has a resistance sufficiently higher than the input impedance of the first-stage amplifier in the main-signal route, the effective capacity remains nearly the same. Therefore, a three-terminal structure can be easily achieved.

Furthermore, in the photodetector 8 of this embodiment, the photoconductor 13 is placed on the surface 111 of the APD 10 through the passivation film 115. This structure can prevent the crosstalk between the APD 10 and the photoconductor 13. In the photodetector 8, not only has the photoconductor 13 a good linearity to a weak signal lightwave L1, but also the crosstalk between the APD 10 and the photoconductor 13 is prevented. Therefore, the output current I2 for controlling the avalanche multiplication factor of the APD 10 can be extracted from the photoconductor 13 with higher accuracy. In addition, when the output current I2 from the photoconductor 13 is leveled by using an integral circuit having a large time constant, an output signal having a further increased accuracy can be achieved.

As described above, the photodetector 8 of this embodiment is provided with the passivation film 115 as an electrical insulator on the surface 111 of the APD 10. It is desirable that the photodetector 8 be provided with the foregoing passivation film 115 as an electrical insulator. This structure can properly prevent the crosstalk between the APD 10 and the photoconductor 13.

The optical receiver 1 of this embodiment is provided with the photodetector 8, which has the above-described effects, and the package 30 for housing the photodetector 8. When the optical receiver 1 is used, the output current I2 for controlling the avalanche multiplication factor of the APD 10 can be extracted from the photoconductor 13 with higher accuracy. Therefore, the avalanche multiplication factor of the APD 10 can be controlled with high accuracy in accordance with the output current I2 from the photoconductor 13. In addition, in the optical receiver 1 of this embodiment, the package 30 is provided with the lens 32. This structure can properly introduce a signal lightwave into the optical-signal-receiving area 11 of the APD 10 and the photoconductor 13.

The optical receiver 1 of this embodiment is provided with the controlling section 5 for controlling the supply voltage P1 to the APD 10 in accordance with the value of the output current I2 from the photoconductor 13 so that the APD 10 can maintain a predetermined avalanche multiplication factor "m." It is desirable that the optical receiver 1 be provided with the foregoing controlling section 5. When this requirement is fulfilled, the avalanche multiplication factor "m" of the APD 10 can be controlled satisfactorily in accordance with the value of the output current I2 from the photoconductor 13.

FIRST EXAMPLE OF MODIFICATION

Figure 7:
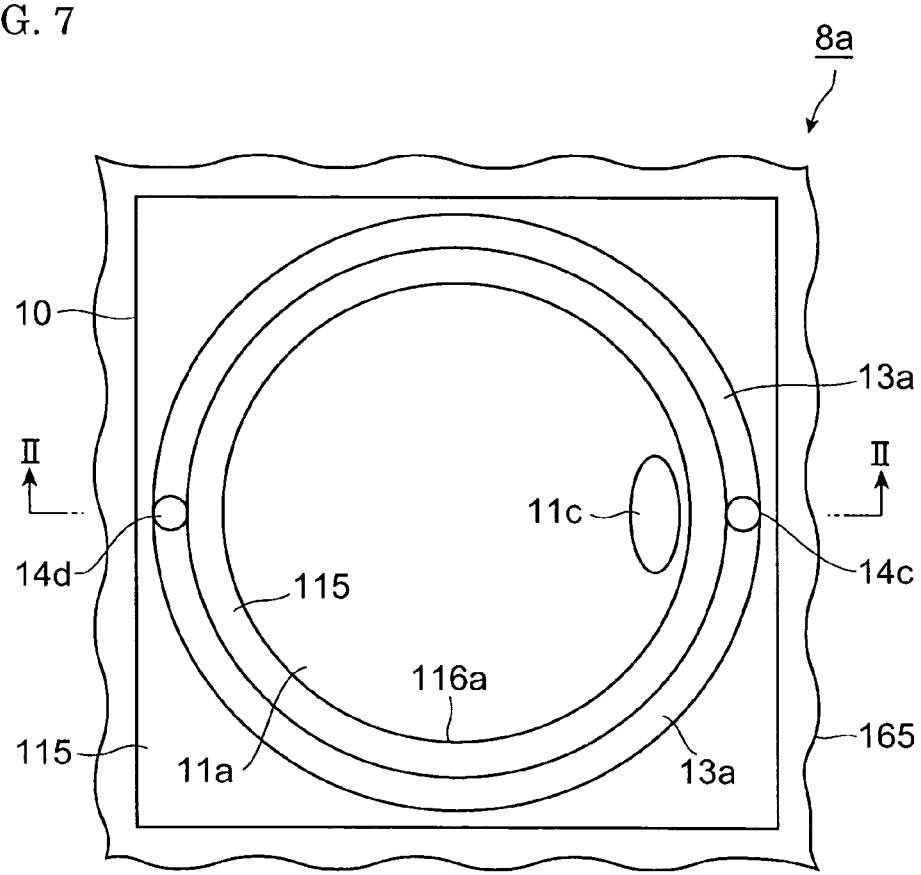
FIG. 7 is a plan view showing a first example of modification to the photodetector of the embodiment of the present invention.
Figure 8:
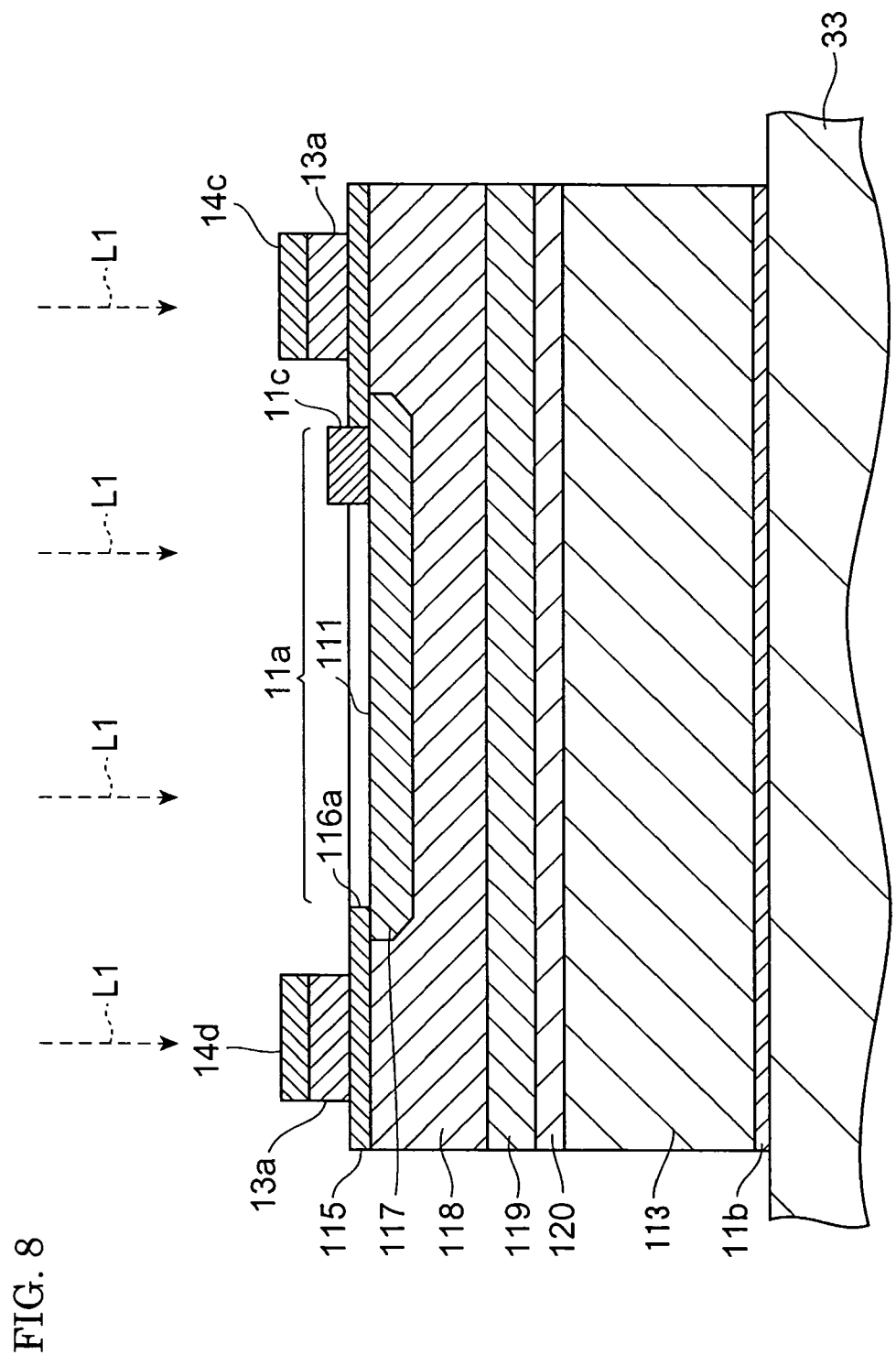
FIG. 8 is a view showing the II-II cross section of the photodetector shown in FIG. 7.

FIG. 7 is a plan view showing a first example of modification to the photodetector 8 in the above-described embodiment. The modified photodetector is referred to as a photodetector 8a. FIG. 8 is a view showing the II-II cross section of the photodetector 8a shown in FIG. 7. The photodetector 8a in this example of modification differs from the photodetector 8 in the above-described embodiment in that a photoconductor 13a is placed at the outside of the entire periphery of the optical-signal-receiving area 11a of the APD 10. As shown in FIGS. 7 and 8, when viewed from above, the photoconductor 13a has the shape of a ring concentric with the optical-signal-receiving area 11a of the APD 10. In other words, it surrounds the optical-signal-receiving area 11a of the APD 10. The ring-shaped photoconductor 13a has electrodes 14c and 14d placed on it in such a way that they are symmetrical with respect to its center.

The photoconductor may be placed at the outside of the entire periphery of the optical-signal-receiving area 11a of the APD 10 as in the case of the photoconductor 13a in this example of modification. As described earlier, the APD 10 receives 90% to 99% of the signal lightwave L1, and the photoconductor 13 receives 1% to 10% of the signal lightwave L1. Consequently, it is recommendable to configure the APD 10 such that the peak of the profile of the signal lightwave L1 lies in the optical-signal-receiving area 11a of the APD 10 and to configure the photoconductor 13a at the outside of the entire periphery of the optical-signal-receiving area 11a of the APD 10 such that the photoconductor 13a receives light at the foot portion of the profile of the signal lightwave L1, as in this example of modification. When this configuration is employed, the signal lightwave L1 having entered the photodetector 8a can be properly distributed to the APD 10 and the photoconductor 13a.

SECOND EXAMPLE OF MODIFICATION

Figure 9:
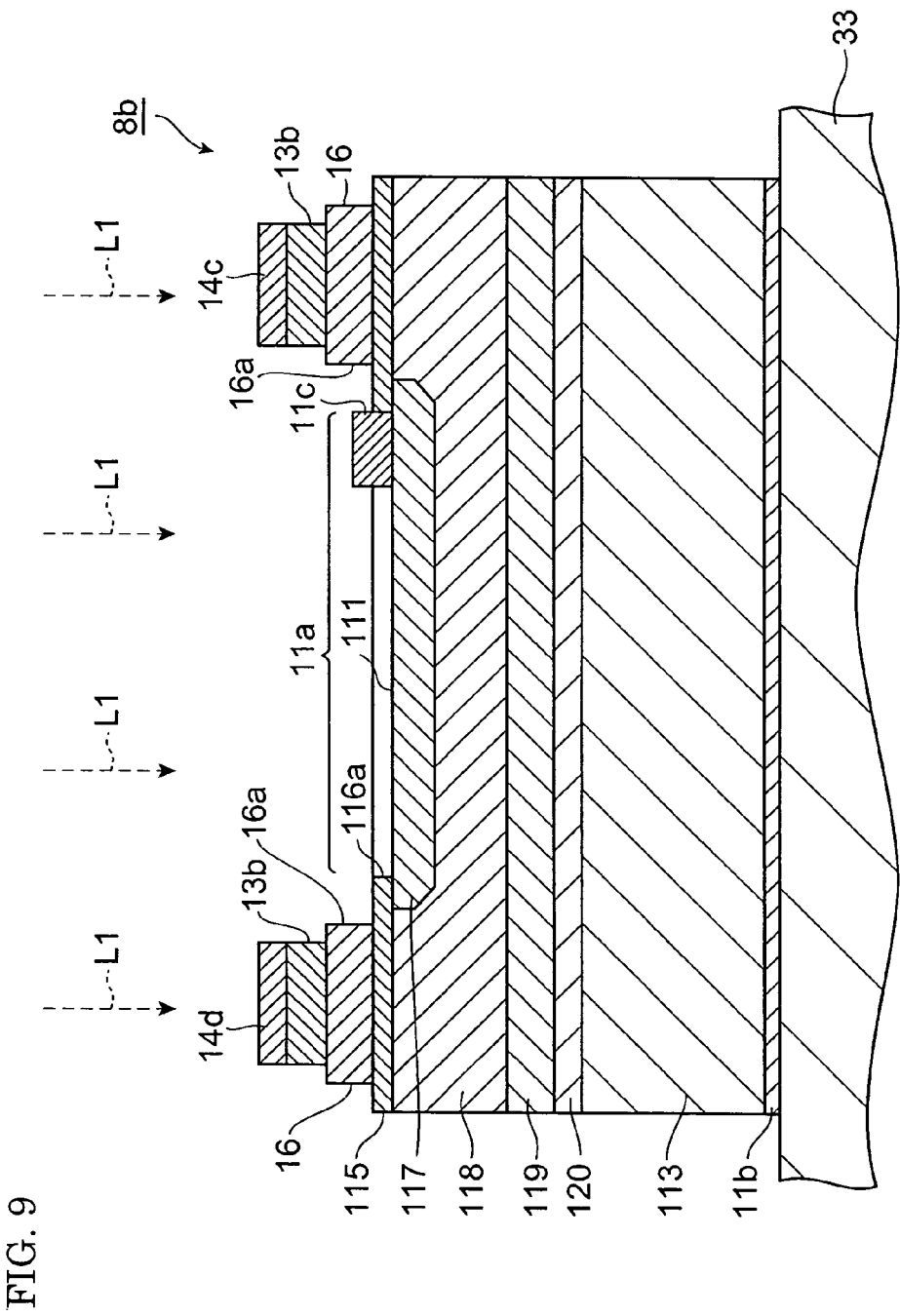
FIG. 9 is a cross-sectional view showing a second example of modification to the photodetector of the embodiment of the present invention.

FIG. 9 is a cross-sectional view showing a second example of modification to the photodetector 8 of the above-described embodiment. The modified photodetector is referred to as a photodetector 8b. The photodetector 8b in this example of modification has a structure in which the photodetector 8a in the foregoing first example of modification is further provided with a substrate 16. More specifically, the photodetector 8b is provided with an insulating substrate, as shown by the substrate 16, as an electrical insulator. The substrate 16 is placed on the surface 111 of the APD 10 (in this example of modification, on the passivation film 115). The substrate 16 has an opening 16a corresponding to the optical-signal-receiving area 11a of the APD 10. Consequently, the signal lightwave L1 can properly enter the optical-signal-receiving area 11a.

As with the photoconductor 13a in the first example of modification, a photoconductor 13b in this example of modification has the shape of a ring concentric with the optical-signal-receiving area 11a of the APD 10, when viewed from above. In other words, it surrounds the optical-signal-receiving area 11a of the APD 10. In addition, in this example of modification, the photoconductor 13b is placed on the substrate 16. The electrodes 14c and 14d of the photoconductor 13b are also placed at the same position as in the first example of modification.

The photodetector 8b in this example of modification is provided with the substrate 16 as an electrical insulator. The electrical insulator to be provided in the photodetector may be composed of not only the passivation film 115 but also an insulating substrate such as the substrate 16. Alternatively, the photodetector may be provided with the substrate 16 alone as an electrical insulator without having the passivation film 115. The electrical insulator can properly prevent the crosstalk between the APD 10 and the photoconductor 13b.

THIRD EXAMPLE OF MODIFICATION

Figure 10:
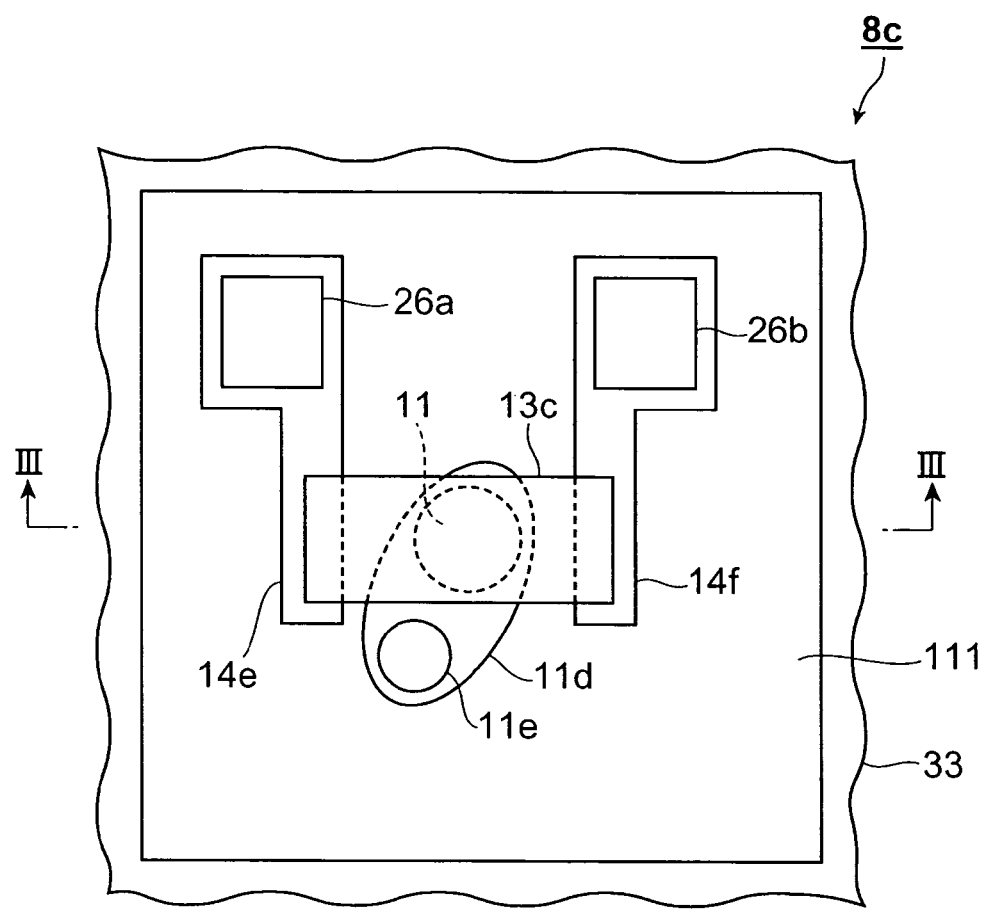
FIG. 10 is a plan view showing a third example of modification to the photodetector of the embodiment of the present invention.
Figure 11:
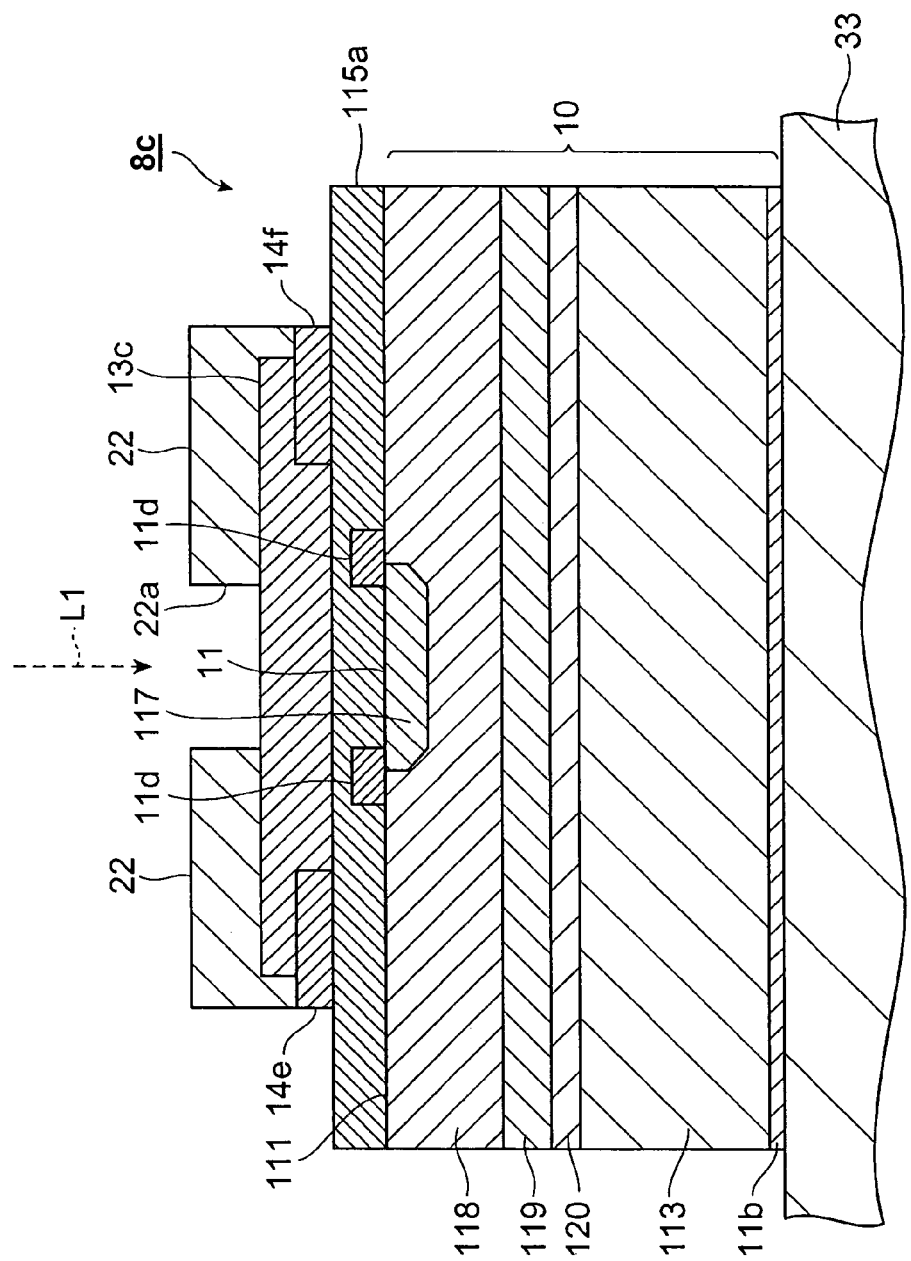
FIG. 11 is a view showing the III-III cross section of the photodetector shown in FIG. 10.

FIG. 10 is a plan view showing a third example of modification to the photodetector 8 of the above-described embodiment. The modified photodetector is referred to as a photodetector 8c. FIG. 11 is a view showing the III-III cross section of the photodetector 8c shown in FIG. 10. In this example of modification, the photodetector 8c has the APD 10 having the same structure as used in the above-described embodiment, except for an anode 11d.

In the photodetector 8c of this example of modification, the anode 11d is placed on the surface 111 such that it surrounds the optical-signal-receiving area 11. The anode 11d is electrically connected to a p-type semiconductor layer 117. The anode 11d extends on the surface 111 to an anode terminal 11e placed at a region apart from the optical-signal-receiving area 11. The anode 11d is electrically connected to the anode terminal 11e. The anode terminal 11e is electrically connected to, for example, the lead pin 34a in the above-described embodiment (see FIG. 3) through a bonding wire or the like.

An insulating layer 115a is formed on the anode 11d and the surface 111. The insulating layer 115a is made of an insulating material capable of transmitting the signal lightwave L1. A photoconductor 13c is placed on the surface 111 (in this example of modification, on the insulating layer 115a) so as to cover the optical-signal-receiving area 11. The photoconductor 13c is made of a material that not only transmits the signal lightwave L1 (semi-transmission is also allowed) but also varies its resistance according to the quantity of incoming light. The types of the material include an organic material such as poly(p-phenylenevinylene), poly (3-alkylthiophene), poly(isocyanaphthene), polyvinylcarbazole (basis) plus trinitrofluorenone (additive), polycarbonate (basis) plus titanyl phthalocyanine (additive), or polycarbonate (basis) plus copper phthalocyanine (additive) and an inorganic material such as CdS or Ge.

In this example of modification, the photoconductor 13c has a rectangular shape extending in a predetermined direction. One end of the photoconductor 13c is electrically connected to a wiring member 14e placed on the insulating layer 115a, and the other end, to a wiring member 14f also placed on the insulating layer 115a. The wiring members 14e and 14f extend in a direction away from the photoconductor 13c. Electrodes 26a and 26b are provided on the extended end portions of the wiring members 14e and 14f, respectively. The wiring members 14e and 14f are, respectively, electrically connected to, for example, the lead pins 34b and 34d in the above-described embodiment (see FIG. 3) through a bonding wire or the like.

As shown in FIG. 11, a mask layer 22 is provided on the photoconductor 13c (the mask layer 22 is not shown in FIG. 10). The mask layer 22 has an opening 22a corresponding to the optical-signal-receiving area 11, so that it blocks the signal lightwave L1 incident upon the region except the opening 22a.

As with the photoconductor 13c in this example of modification, the photoconductor may be made of a material capable of transmitting the signal lightwave L1 and be placed so as to cover the optical-signal-receiving area 11 of the APD 10. When this structure is employed, the signal for controlling the avalanche multiplication factor of the APD 10 can be obtained at a high signal-to-noise (S/N) ratio with a notably simpler structure than conventional optical receivers (see FIG. 13). In addition, the signal lightwave L1 having entered the photodetector 8c can be distributed to the APD 10 and the photoconductor 13c with a suitable ratio without being affected by the variation in the optical axis and range of incidence of the signal lightwave L1.

In addition, when a photodiode is formed on the same substrate that the APD is formed on such that the photodiode covers the APD, for example, the capacity of the APD may increase and deteriorate the signal accuracy of the APD. On the other hand, as in this example of modification, when a structure is employed in which the photoconductor 13c covers the APD 10, the capacity of the APD 10 remains nearly the same.

As with this example of modification, it is desirable that the photodetector 8c be provided with the mask layer 22 having the opening 22a corresponding to the optical-signal-receiving area 11. This structure can further reduce the influence of the variation in the optical axis of the signal lightwave L1 incident upon the photodetector 8c and of the variation in the range of incidence of the signal lightwave L1.

Furthermore, the photodetector 8c in this example of modification allows the following modification. That is, in place of the mask layer 22, the wiring members 14e and 14f together providing an opening corresponding to the optical-signal-receiving area 11 may be placed on the photoconductor 13c. Alternatively, one of the wiring members 14e and 14f of the photoconductor 13c may be electrically connected to the cathode 11b of the APD 10. Yet alternatively, a structure may be employed in which a signal lightwave is introduced from the cathode 11b side of the APD 10 to detect it with the APD 10 and to detect a lightwave having passed through the APD 10 with the photoconductor 13c.

Moreover, without providing the insulating layer 115a, one of the wiring members 14e and 14f of the photoconductor 13c may be electrically connected to the anode 11d (or the anode terminal 11e) of the APD 10. In this case, it is desirable that the photoconductor 13c have a resistance sufficiently higher than the impedance of a high-speed amplifier to be connected to the anode terminal 11e.

FOURTH EXAMPLE OF MODIFICATION

Figure 12:
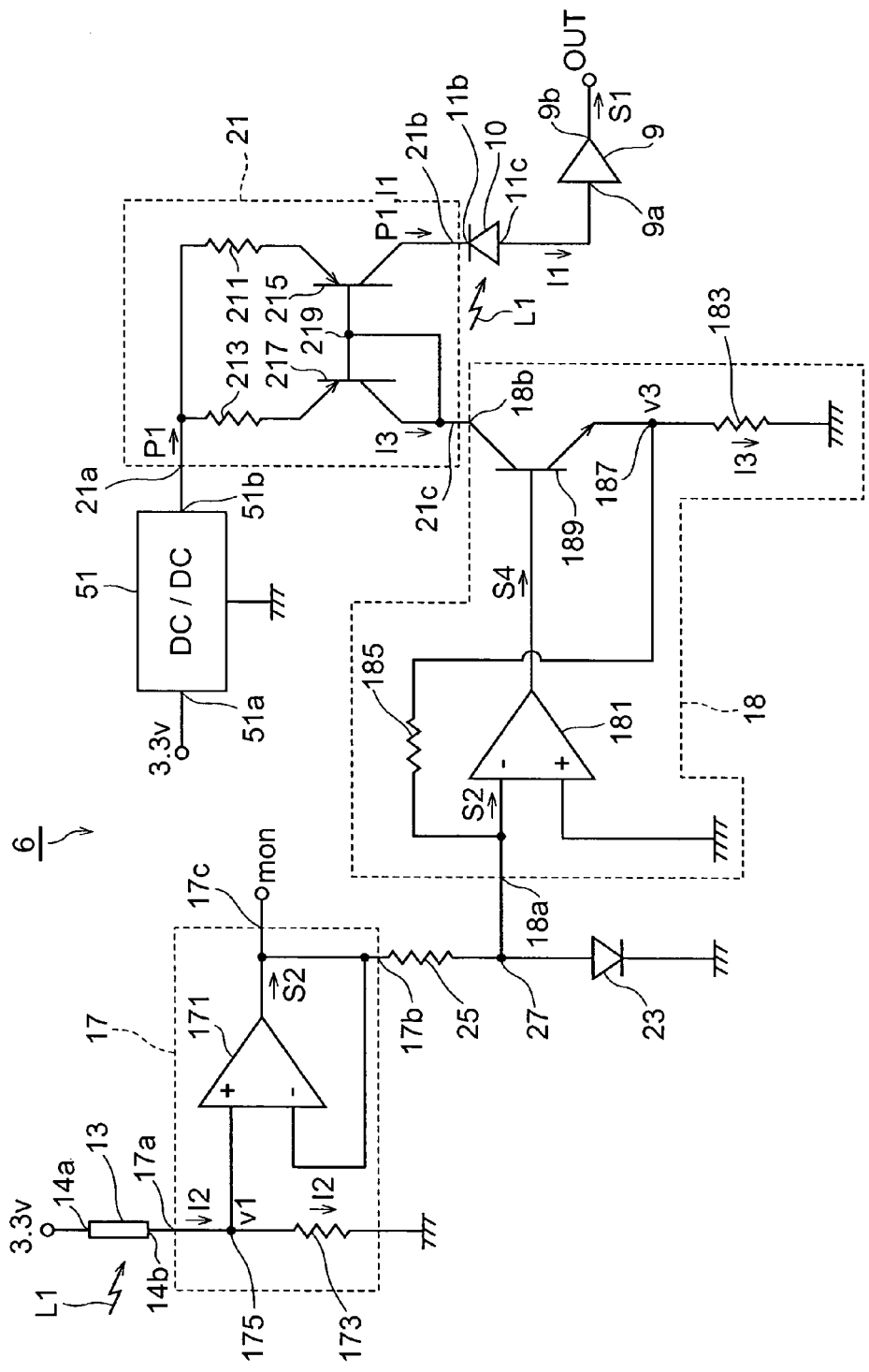
FIG. 12 is a circuit diagram showing the internal circuit of a modified controlling section as a fourth example of modification in the optical receiver of the embodiment of the present invention.

FIG. 12 is a circuit diagram showing the internal circuit of a modified controlling section 6 as a fourth example of modification in the optical receiver 1 of the above-described embodiment. The controlling section 6 of this example of modification has the same structure as that of the controlling section 5 of the above-described embodiment (see FIG. 6), except for the following points. That is, the controlling section 6 of this example of modification has a current control circuit 18 and a DC-DC converter 51 in place of the voltage control circuit 19 and the DC-DC converter 7 in the above-described embodiment. In addition, unlike the above-described embodiment, in the controlling section 6 of this example of modification, an output terminal 21b (second output terminal) of the current mirror circuit 21 is electrically connected to the cathode 11b of the APD 10. An output terminal 21c (first output terminal) of the current mirror circuit 21 is electrically connected to the current control circuit 18.

The current control circuit 18 includes an OP amplifier 181, resistance elements 183 and 185, and an NPN transistor 189. It also has input terminals 18a and 18b. The minus-side input terminal of the OP amplifier 181 is electrically connected to a node 27 via the input terminal 18a and to a node 187 through the resistance element 185. The plus-side input terminal of the OP amplifier 181 is electrically connected to the ground potential line. The output terminal of the OP amplifier 181 is electrically connected to the base of the transistor 189. The collector of the transistor 189 is electrically connected to the output terminal 21c of the current mirror circuit 21 via the input terminal 18b. The emitter of the transistor 189 is electrically connected to the ground potential line through the node 187 and the resistance element 183.

The DC-DC converter 51 is a power supply circuit in this example of modification. It has an input terminal 51a and an output terminal 51b. The input terminal 51a is electrically connected to a terminal of a power source having a specific output voltage (3.3 V, for example). The output terminal 51b is electrically connected to an input terminal 21a of the current mirror circuit 21. Unlike the DC-DC converter 7 in the above-described embodiment, the DC-DC converter 51 converts the supply voltage from the terminal of the power source into a predetermined supply voltage P1 (80 V, for example). The DC-DC converter 51 supplies the supply voltage P1 to the current mirror circuit 21 from the output terminal 51b.

Next, the operation of this example of modification is explained below. The following description omits the explanation for the same operation as that of the optical receiver 1 in the above-described embodiment.

When a signal lightwave L1 enters the photoconductor 13, a voltage signal S2 is produced in the converting circuit 17. The voltage signal S2 is fed into the current control circuit 18 and enters the minus-side terminal of the OP amplifier 181. Then, a control signal S4 is produced in the OP amplifier 181. The control signal S4 is inputted into the base of the transistor 189. A current I3 according to the control signal S4 flows through the emitter and collector of the transistor 189. When the current I3 flows through the resistance element 183, a voltage V3 is produced at the node 187. The voltage V3 is negatively fed back to the minus-side input terminal of the OP amplifier 181 through the resistance element 185. Consequently, the voltage of the control signal S4 comes to have a magnitude produced by multiplying the voltage of the voltage signal S2 by a predetermined value.

Thus, the value of the current I3 is determined in accordance with the magnitude of the control signal S4.

On the other hand, the DC-DC converter 51 applies the supply voltage P1 as a reverse bias voltage across the cathode 11b and anode 11c of the APD 10 through the current mirror circuit 21. Under this condition, when a signal lightwave L1 enters the APD 10, an output current I1 flows through the APD 10. At this moment, the current mirror circuit 21 causes the value of the current I1 flowing through the resistance element 211 and the transistor 215 to be nearly equal to that of the current I3 flowing through the resistance element 213 and the transistor 217. In other words, because the value of the current I3 is controlled by the current control circuit 18 as described above, the output current I1 having nearly the same value as that of this current I3 flows through the APD 10. The output current I1 is converted into a voltage signal by the amplifier 9 to form a received signal S1. Thus, the received signal S1 is sent out of the optical receiver 1.

The above-explained operation controls the output current I1 of the APD 10, so that the APD 10 can maintain an intended avalanche multiplication factor "m." As in the above-described embodiment, in this example of modification, it is desirable to determine the value of the resistance element 183 by the following procedure. First, when a lightwave having a certain quantity of light enters the optical receiver 1, measurements are conducted to obtain the value of the output current I1 (Iava$_2$) of the APD 10 in the PIN mode and the value of the output current I2 (Idtr$_2$) of the photoconductor 13. Second, the ratio between the two values and an intended avalanche multiplication factor "m" are used to calculate the product "m·(Iava$_2$/Idtr$_2$)." This product is used to determine the value of the resistance element 183.

In this example of modification, the controlling section 6 controls the output current I1 flowing through the APD 10 in accordance with the value of the output current I2 from the photoconductor 13 so that the APD 10 can maintain a predetermined avalanche multiplication factor "m." The optical receiver 1 can also satisfactorily control the avalanche multiplication factor of the APD 10 by incorporating the foregoing controlling section 6.

The optical receiver of the present invention is not limited to the above-described embodiment and examples of modification. Other various modifications can be implemented. For example, the shape of the optical-signal-receiving area of the APD and the photoconductor when viewed from above can be modified to various shapes from the ones shown in the above-described embodiment and examples of modification. In addition, in the above-described embodiment, the controlling section controls the supply voltage to the APD, and in the fourth example of modification, it controls the value of the current flowing through the APD. Nevertheless, the controlling means may control both the supply voltage and the current at the same time.

What is claimed is:

1. A photodetector comprising:
   (a) an avalanche photodiode having an optical-signal-receiving area on a surface thereof; and
   (b) a photoconductor placed on the surface of the avalanche photodiode at the outside of the periphery of the optical-signal-receiving area of the avalanche photodiode.

2. The photodetector as defined by any one of claims 1, the photodetector further comprising an electrical insulator placed between the surface of the avalanche photodiode and the photoconductor.

3. The photodetector as defined by claim 2, wherein the electrical insulator is a passivation film formed on the surface of the avalanche photodiode.

4. The photodetector as defined by claim 2, wherein the electrical insulator is an insulating substrate placed on the surface of the avalanche photodiode and has an opening corresponding to the optical-signal-receiving area of the avalanche photodiode.

5. The photodetector as defined by claim 3, wherein the passivation film has an opening corresponding to the optical-signal-receiving area of the avalanche photodiode.

6. An optical receiver for receiving a signal lightwave, the optical receiver comprising:
   (a) a photodetector comprising:
      (a1) an avalanche photodiode having an optical-signal-receiving area on a surface thereof; and
      (a2) a photoconductor placed on the surface of the avalanche photodiode at the outside of the periphery of the optical-signal-receiving area of the avalanche photodiode; and
   (b) a package that:
      (b1) houses the photodetector; and
      (b2) is provided with a lens that condenses the signal lightwave to send it to the avalanche photodiode and the photoconductor of the photodetector.

7. An optical receiver for receiving a signal lightwave, the optical receiver comprising:
   (a) a photodetector comprising:
      (a1) an avalanche photodiode having an optical-signal-receiving area on a surface thereof; and
      (a2) a photoconductor placed on the surface of the avalanche photodiode at the outside of the periphery of the optical-signal-receiving area of the avalanche photodiode; and
   (b) a controlling means for controlling at least one of the supply voltage to the avalanche photodiode and the current flowing through the avalanche photodiode in accordance with the value of the output current of the photoconductor so that the avalanche photodiode can maintain an intended avalanche multiplication factor.

8. The optical receiver as defined by claim 7, wherein the controlling means controls at least one of the supply voltage to the avalanche photodiode and the current flowing through the avalanche photodiode such that the average value of the output current of the avalanche photodiode receiving the signal lightwave approaches the value expressed by the following formula:

$$m \cdot Idtr_1 \cdot (Iava_2/Idtr_2)$$

where "m" is an intended avalanche multiplication factor;
   Idtr$_1$ is the value of the output current from the photoconductor; and
   Iava$_2$ and Idtr$_2$ are respectively the value of the output current of the avalanche photodiode in the PIN mode and the value of the output current of the photoconductor when the optical receiver receives a lightwave having a certain quantity of light.

9. The optical receiver as defined by claim 7 or 8, wherein the controlling means comprises:
   (a) a converting circuit for converting the value of an output current from the photoconductor into a voltage signal;
   (b) a current mirror circuit that comprises (b1) an input terminal, (b2) a first output terminal connected to the avalanche photodiode, and (b3) a second output terminal and that is structured such that the value of the current at the second output terminal is nearly equal to the value of the current at the first output terminal;

(c) a power supply circuit for supplying the supply voltage to the input terminal of the current mirror circuit; and (d) a voltage control circuit for controlling the supply voltage in accordance with both the voltage signal from the converting circuit and the value of the current at the second output terminal of the current mirror circuit.

10. The optical receiver as defined by claim 7 or 8, wherein the controlling means comprises:

(a) a converting circuit for converting the value of an output current from the photoconductor into a voltage signal;

(b) a current mirror circuit that comprises (b1) an input terminal, (b2) a first output terminal, and (b3) a second output terminal connected to the avalanche photodiode and that is structured such that the value of the current at the second output terminal is nearly equal to the value of the current at the first output terminal;

(c) a power supply circuit for supplying the supply voltage to the input terminal of the current mirror circuit; and (d) a current control circuit for controlling the value of the current at the first output terminal of the current mirror circuit in accordance with the voltage signal from the converting circuit.

* * * * *